United States Patent
Rose

(10) Patent No.: US 9,929,296 B1
(45) Date of Patent: Mar. 27, 2018

(54) EDGE REFLECTOR OR REFRACTOR FOR BIFACIAL SOLAR MODULE

(75) Inventor: Douglas H. Rose, San Jose, CA (US)

(73) Assignee: SunPower Corporation, San Jose, CA (US)

(*) Notice: Subject to any disclaimer, the term of this patent is extended or adjusted under 35 U.S.C. 154(b) by 1693 days.

(21) Appl. No.: 12/644,609

(22) Filed: Dec. 22, 2009

(51) Int. Cl.
*H01L 31/00* (2006.01)
*H01L 31/056* (2014.01)
*H01L 31/0352* (2006.01)
*H01L 31/054* (2014.01)
*H01L 31/048* (2014.01)
*H01L 31/0236* (2006.01)

(52) U.S. Cl.
CPC ........ *H01L 31/056* (2014.12); *H01L 31/0352* (2013.01); *H01L 31/0547* (2014.12); *H01L 31/02363* (2013.01); *H01L 31/048* (2013.01)

(58) Field of Classification Search
USPC ................................................ 136/243–293
See application file for complete search history.

(56) References Cited

U.S. PATENT DOCUMENTS

| | | | |
|---|---|---|---|
| 4,084,985 A * | 4/1978 | Evans, Jr. ..................... | 136/251 |
| 5,538,563 A * | 7/1996 | Finkl ............................. | 136/246 |
| 5,990,413 A | 11/1999 | Ortabasi | |
| 5,994,641 A | 11/1999 | Kardauskas | |
| 6,017,002 A * | 1/2000 | Burke et al. ............... | 244/172.8 |
| 6,323,415 B1 * | 11/2001 | Uematsu et al. ........... | 136/246 |
| 6,570,083 B2 * | 5/2003 | Gravisse et al. ............ | 136/246 |
| 7,390,961 B2 | 6/2008 | Aschenbrenner et al. | |
| 2008/0230047 A1 | 9/2008 | Shugar et al. | |
| 2009/0120486 A1 | 5/2009 | Buller | |
| 2009/0133739 A1 * | 5/2009 | Shiao et al. .................. | 136/251 |
| 2009/0178704 A1 * | 7/2009 | Kalejs et al. ................ | 136/246 |
| 2009/0194146 A1 * | 8/2009 | Simon .......................... | 136/248 |

* cited by examiner

*Primary Examiner* — Thanh Truc Trinh
(74) *Attorney, Agent, or Firm* — Okamoto & Benedicto LLP

(57) ABSTRACT

One embodiment relates to a bifacial photovoltaic module having an edge reflector. The module includes a plurality of solar cells in an array, each solar cell having a front side and a back side. A reflector is configured on an edge of the array of solar cells, the first reflector being configured to reflect light onto the front side of a row of solar cells adjacent to the edge. Another embodiment relates to a method of reducing non-uniformity of power generation from a bifacial photovoltaic module. Electrical current produced from solar cells along at least one edge of the array is increased by using a reflective strip facing towards the front side of the solar cells along the edge. Another embodiment relates to a bifacial photovoltaic module having an edge refractor. Other embodiments and features are also disclosed.

11 Claims, 9 Drawing Sheets

EDGE REFLECTOR OR REFRACTOR FOR BIFACIAL SOLAR MODULE

STATEMENT REGARDING FEDERALLY SPONSORED RESEARCH OR DEVELOPMENT

The invention described herein was made with government support under contract number DE-FC36-07GO17043 awarded by the United States Department of Energy. The United States Government may have certain rights in the invention.

BACKGROUND OF THE INVENTION

1. Field of the Invention

The present disclosure relates generally to photovoltaic modules, and more particularly to bifacial photovoltaic modules.

2. Description of the Background Art

Photovoltaic modules use cells that convert sunlight into electrical power. Typical modules are monofacial, meaning that they convert illumination to power only on the front side of the module. In contrast, bifacial modules convert illumination on both the front and back of the module into electrical power.

The bifacial coefficient of a bifacial module or cell is the ratio of back side efficiency to the front side efficiency, where the efficiency is defined as the ratio of maximum electrical output versus the light energy input under certain standard conditions. Typical bifacial coefficients range from 20% to 100%.

SUMMARY

One embodiment relates to a bifacial photovoltaic module having an edge reflector. The module includes a plurality of solar cells in an array that convert illumination on both a front side and a back side of the cells into energy. A reflector is configured on an edge of the array of solar cells, the first reflector being configured to reflect light onto the front side of a row of solar cells adjacent to the edge.

Another embodiment relates to a bifacial photovoltaic module which includes a refractive element on one or more edges of the array of solar cells. The refractive element is configured to refract light onto the row of solar cells adjacent to the edge.

Another embodiment relates to a method of reducing non-uniformity of power generation from solar cells of a bifacial photovoltaic module. Electrical current produced from solar cells along at least one edge of an array of bifacial cells is preferentially increased by using a reflective or refractive strip which increases the illumination on the cells at the edge of the array. Surprisingly, increasing the electrical current produced from the solar cells along the edge decreases (rather than increases) the non-uniformity of the power generation from the solar cells in the array.

Other embodiments, aspects and features are also disclosed.

DETAILED DESCRIPTION

Figure 1:
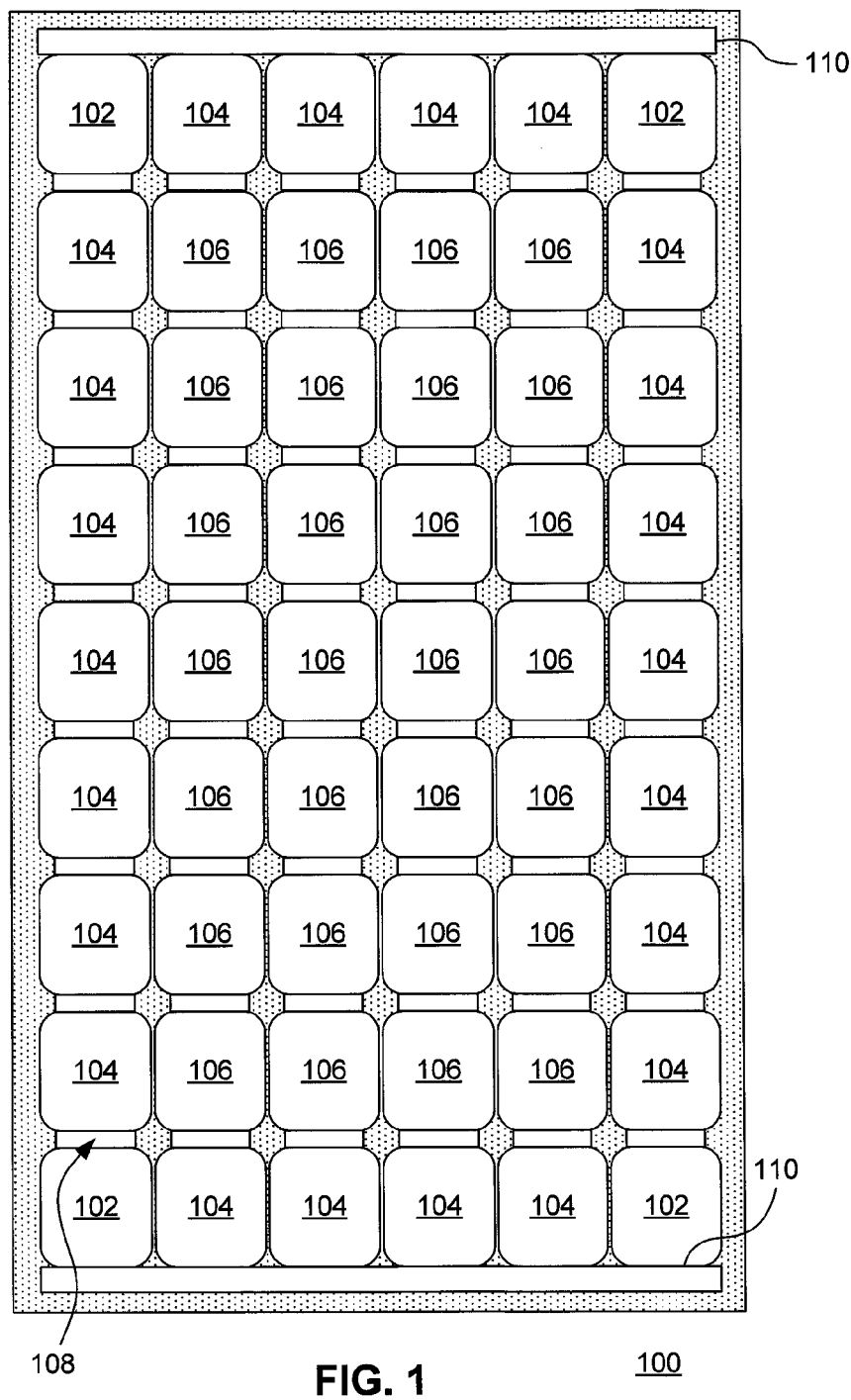
FIG. 1 is a schematic diagram showing a top view of a front side of a bifacial photovoltaic module in accordance with an embodiment of the invention.

The power rating of a solar panel is the maximum power that it can produce under certain standard conditions, typically 1000 W/m$^2$, AM 1.5 spectrum, 25° C. cell temperature, and collimated light that is normal to the front surface of the panel. The primary value of solar panel is the energy it produces, and that energy is influenced by more than the power rating of the panel.

The following provides a simplified example to aid in the understanding of the potential energy production advantage of a bifacial module. If a bifacial module with a bifacial coefficient of 50% is used in a mounting arrangement wherein the back side of the module receives 20% as much illumination as the front side, then approximately 10% (=50%×20%) more energy may be generated compared to a monofacial module with the same mounting arrangement. This potential benefit from a bifacial module is offset by various disadvantages of bifacial modules which have limited their widespread adoption.

Applicant has determined that one substantial disadvantage of bifacial module is that the energy produced is substantially reduced if the back side illumination is non-uniform (rather than uniform) over the module. This occurs because at least a portion of the solar cells within a module are connected in series in order to deliver power at a usable voltage with acceptable series-resistance losses, and all solar cells that are connected in series must operate at the same current unless a low-current cell is by-passed. In extreme cases, the non-uniform back side illumination may cause some cells to operate in reverse bias, resulting in a further decrease in power and possibly a reliability risk.

Applicant has determined that three frequent sources of non-uniform current contribution in bifacial modules are: 1) shading of the backs of end-row cells from a junction box and/or busbars that are located behind cells; 2) shading of the backs of cells at the edges of the module from the module frame, and 3) shading of edge row (or column) cells due to soiling that preferentially occurs at the bottom edge of an installed module. The first two of the aforementioned sources are unique to bifacial modules as they would not affect the current for monofacial modules.

The third aforementioned source (shading of edge row or column cells due to soiling) typically results in a greater non-uniform current contribution in bifacial modules compared with monofacial modules. This is because bifacial modules typically use clear backsheets in order to allow illumination of the back side of the cells, while a backsheet with some reflectivity is typically used in a monofacial module so that light falling on the module outside of one of the solar cells is partially captured. For example, light falling in the gaps between the cells, or in the gap between the edge cells and the edge of the module, may be partially captured. This capture typically occurs by reflection from the backsheet, followed by internal reflection from the glass/air interface on the front side of the module. Some of the internally reflected light is then captured by the front surface of a solar cell. The total capture fraction for light falling in between solar cells (i.e. falling in the gaps) is typically on the order of 50%. Since the gap between the edge cells of the module and the edge of the module is generally more than twice the gap between the cells, the reflective backsheet in a monofacial module gives partial protection from soiling of the bottom edge cells as long as some light penetrates the soiled layer.

Applicant has further determined that a fourth source of non-uniform current contribution from the back side of a bifacial module occurs if reflective material (reflective interconnects or reflective shield tape) is used on the front side of the module in between the cells. The reflective material between cells results in an increase in the front-side power to the interior cells compared to the end-row cells. This is because all of the interior cells have two adjacent interconnects, while the cells of the end rows only have one adjacent interconnect.

The present disclosure provides apparatus and methods which may potentially reduce or eliminate all four of the aforementioned sources of non-uniformity in bifacial modules. Embodiments of the present invention advantageously prevent or reduce the likelihood of edge cells operating as current limiters in bifacial modules, even with one or more of the aforementioned sources of non-uniformity.

FIG. 1 is a schematic diagram showing a top view of a front side of a bifacial photovoltaic module 100 in accordance with an embodiment of the invention. As shown, the bifacial photovoltaic (PV) module 100 includes a plurality of solar cells (102, 104, and 106) in an array. The solar cells on an edge (either a shorter edge or a longer edge) may be referred to as edge cells 102 and 104, and the solar cells in the corners (i.e. on both a shorter edge and a longer edge) may be referred to as corner edge cells 102. The solar cells in the interior of the module array (i.e. not on an edge) may be referred to as center (interior) cells 106. In addition, as shown, the bifacial PV module 100 may include interconnect 108 between solar cells which are adjacent along the longer edge. The interconnect 108 may be with or without an interconnect shield.

In accordance with an embodiment of the invention, front-side reflective strips 110 may be added on the edges of the bifacial PV module 100. As shown in FIG. 1, for example, the reflective strips may be adjacent to edge cells on two opposing edges of the module 100. In the implementation depicted, the reflective strips 110 are positioned along the short edges of a bifacial PV module 100 that is intended for "portrait" mounting (where one of the short edges is horizontal and closest to the ground) or where frame shadowing is expected to cause the short edge rows to potentially be current limiters. In another implementation, the reflective strips 110 may be positioned along the long edges of a bifacial PV module 100 that is intended for "landscape" mounting (where one of the long edges is horizontal and closest to the ground) or where frame shadowing is expected to cause the long edge rows to potentially be current limiters.

The reflective strip 110 may be made using a reflective material such as, for example, EPE (EVA/polyester/EVA), where the EVA is preferably colored white. EVA stands for Ethylene Vinyl Acetate. Alternative materials that may be used for the reflective strip include Tedlar® polyvinyl fluoride (PVF), colored polyester, colored EVA, colored silicone, and colored thermoplastics. A light color such as white is preferable for greater reflectivity. Diffuse reflection is preferable for increased internal reflection when using a substantially flat (i.e., substantially parallel to the plane of the front glass) reflective strip 110.

Figure 2A:
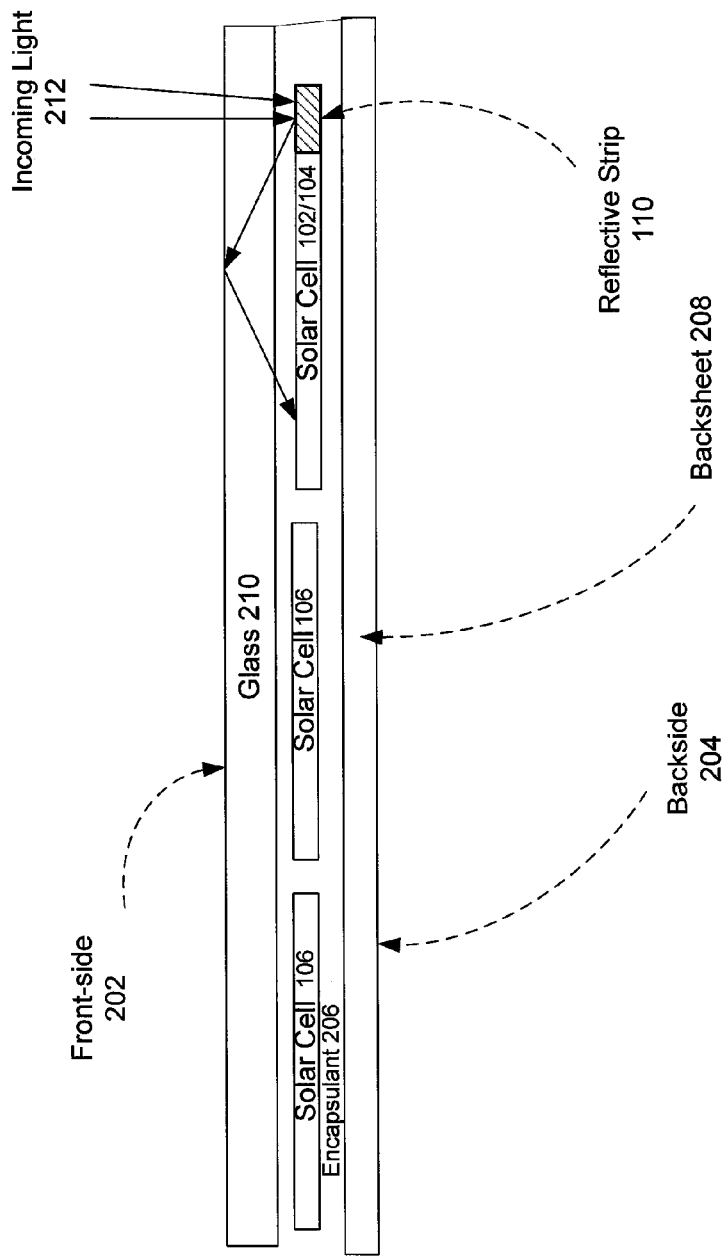
FIG. 2A is a cross-sectional view of a portion of a bifacial photovoltaic module in accordance with an embodiment of the invention.

FIG. 2A is a cross-sectional view of a portion of a bifacial photovoltaic module 100 showing a reflective edge strip 110 in accordance with an embodiment of the invention. As seen, the silicon (solar) cells 102/104 may be embedded within an encapsulant material 206. Encapsulant material other than EVA may be used, for example, silicone-based materials or thermoplastics, such as polyolefin or PVB. A glass pane (front glass) 210 may cover the front side of the module. The back side of the bifacial module may be covered by a backsheet 208. The backsheet 208 may be, for example, glass or a clear polymer.

As discussed above, the front side of the module may advantageously include the reflective strip 110 positioned at one or more edges of the module. As shown, the edge reflective strip 110 may be positioned in the plane of the solar cells. An example path of light 212 reflected by the edge reflective strip 110 is shown as the sunlight is reflected from the strip 110, internally reflected by the front glass 210, and then illuminates the front face of an edge cell 102/104.

In one embodiment, a light ray may be internally reflected at the glass/air interface. Internal reflection can occur when the angle of incidence of the ray is greater than the critical angle, where the angle of incidence is measured with respect to the normal at the refractive boundary. The critical angle for a glass/air interface is approximately 42 degrees. Note that the index of refraction of the encapsulant may be slightly below that of the glass, such that a light path would also have a change of direction (not shown) at the glass/encapsulant interface.

Note further that the cross-sectional drawings in the present disclosure are for purposes of explanation and are not to scale. In one particular implementation, the actual length of the cell is 125 millimeters, and the cell to edge gap is 16 millimeters. In this implementation, the thicknesses of the various components are as follows.

front glass: 3.2 mm
front encapsulant: 0.45 mm
solar cell: 0.20 mm
back encapsulant: 0.45 mm
back sheet or back glass: 0.23-3.2 mm The lengths and thicknesses of the various components may vary in different implementations depending on various factors.

Figure 2B:
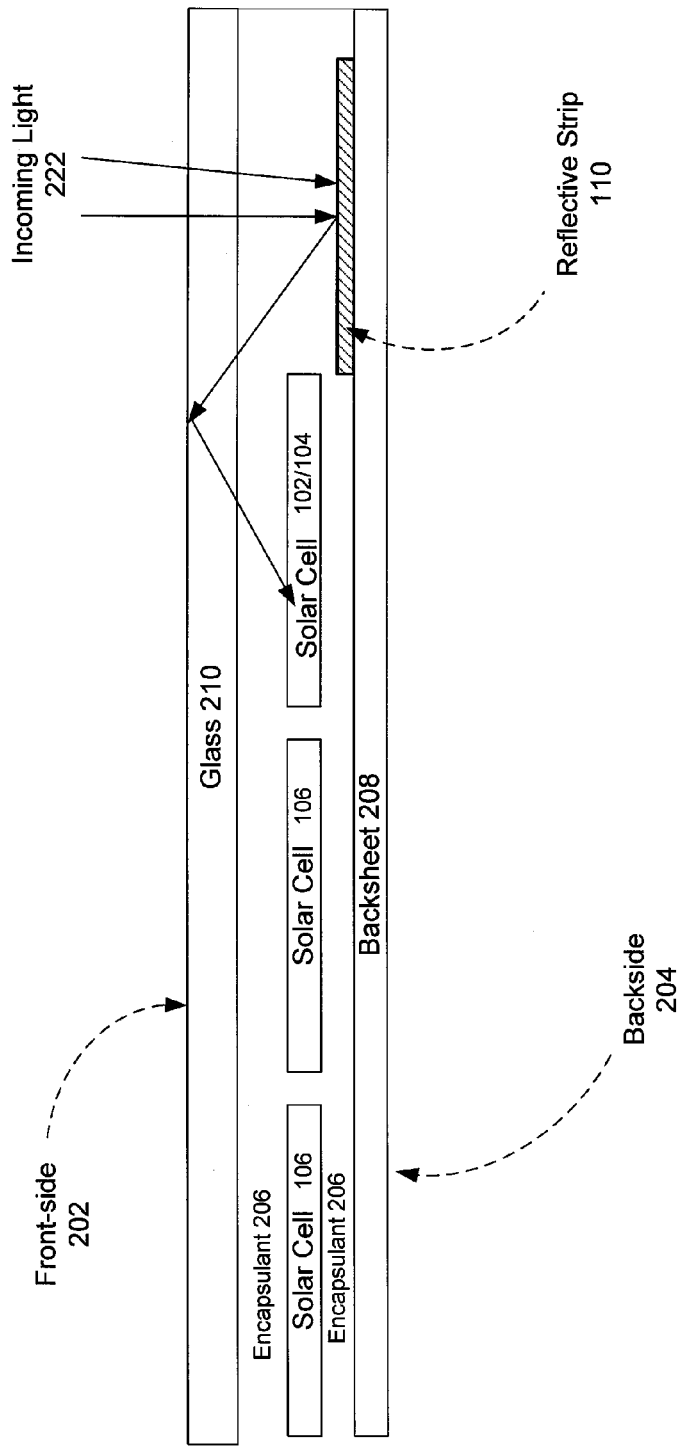
FIG. 2B is a cross-sectional view of a portion of a bifacial photovoltaic module in accordance with an alternate embodiment of the invention.

In accordance with another embodiment of the invention, the backsheet 208 may include a reflective material preferentially on one or more edges. This is unlike a typical conventional bifacial module which utilizes a clear backsheet. FIG. 2B is a cross-sectional view of an embodiment which includes a reflective material strip 110 at an edge of the module on the backsheet 208 (instead of in the plane of the solar cells). An example path of light 222 reflected by the reflective material strip 110 is shown as the sunlight is reflected from the strip 110, internally reflected by the front glass 210, and then illuminates the front face of an edge cell 102/104.

Figure 3:
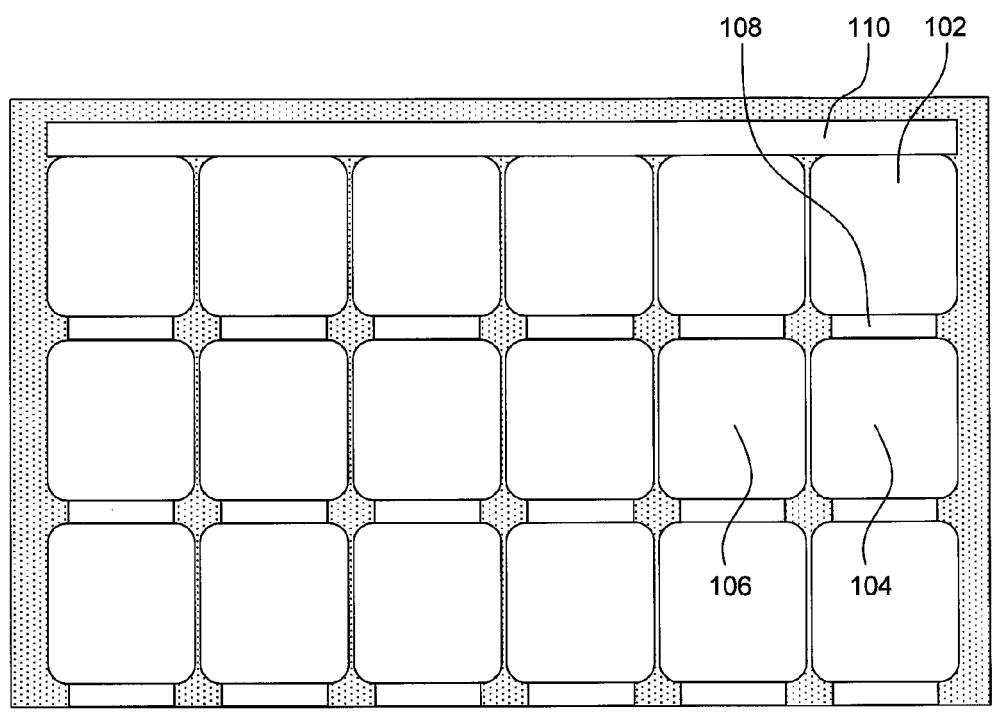
FIG. 3 is a closer-up top view of an upper portion of a front side of a bifacial photovoltaic module showing a reflective edge strip in accordance with an embodiment of the invention.

FIG. 3 is a closer-up top view of an upper portion of a front side of a bifacial photovoltaic module in accordance with an embodiment of the invention. The solar cells depicted include corner edge cells 102, side edge cells 104 and center (interior) cells 106. Also depicted are interconnects 108 between adjacent solar cells (in this case, between adjacent cells in the direction of the long dimension of the module). Finally, depicted is the reflective strip 110 (in this case, along the short edge of the module).

Figure 4:
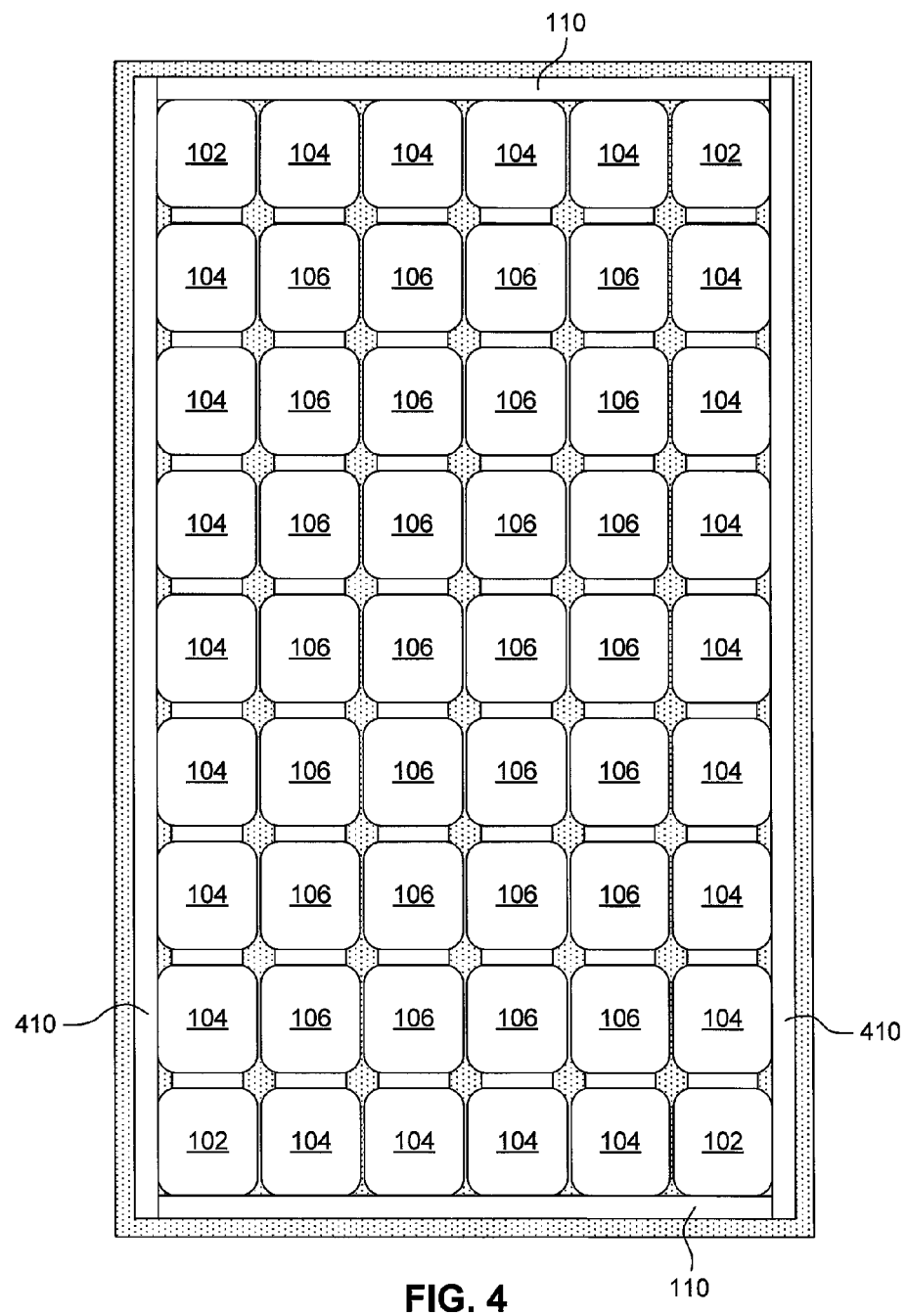
FIG. 4 is a schematic diagram showing a top view of a front side of a bifacial photovoltaic module in accordance with another embodiment of the invention.

FIG. 4 is a schematic diagram showing a top view of a front side of a bifacial photovoltaic module in accordance with another embodiment of the invention. In this embodiment, one pair of reflective strips 110 is shown as positioned on the short edges of the module, and another pair of reflective strips 410 is shown as positioned on the long edges of the module.

Figure 5:
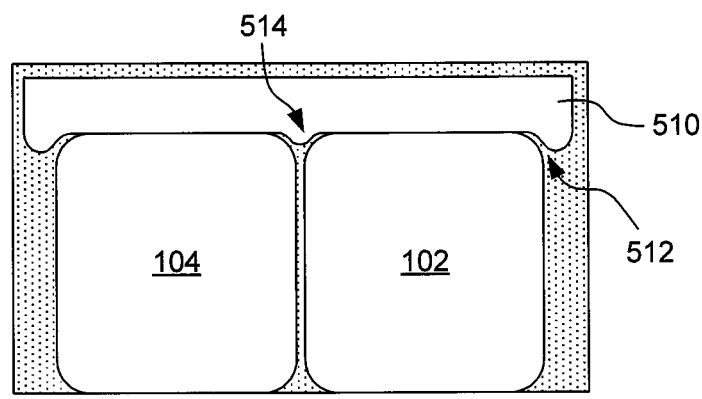
FIG. 5 is a closer-up top view of a corner portion of a front side of a bifacial photovoltaic module showing non-rectangular features on a reflective strip in accordance with another embodiment of the invention.

FIG. 5 is a closer-up top view of a corner portion of a front side of a bifacial photovoltaic module showing non-rectangular features on a reflective strip in accordance with another embodiment of the invention. In this embodiment, the reflective strip 510 is non-rectangular. As shown, the reflective strip 510 includes a non-rectangular feature 512 which fills a triangular (quarter-diamond) area at the corner of the solar cell array. The reflective strip 510 also includes a non-rectangular feature 514 which fills a triangular (half-diamond) area of the end row of the solar cell array.

With these non-rectangular features, the reflective strip ends up having a "scalloped edge" on the side facing the solar cell array. Such a scalloped edge may be included on each of the reflective strips. The additional non-rectangular features may be used to advantageously increase the light reflected onto the front side of the edge rows of the array.

Figure 6A:
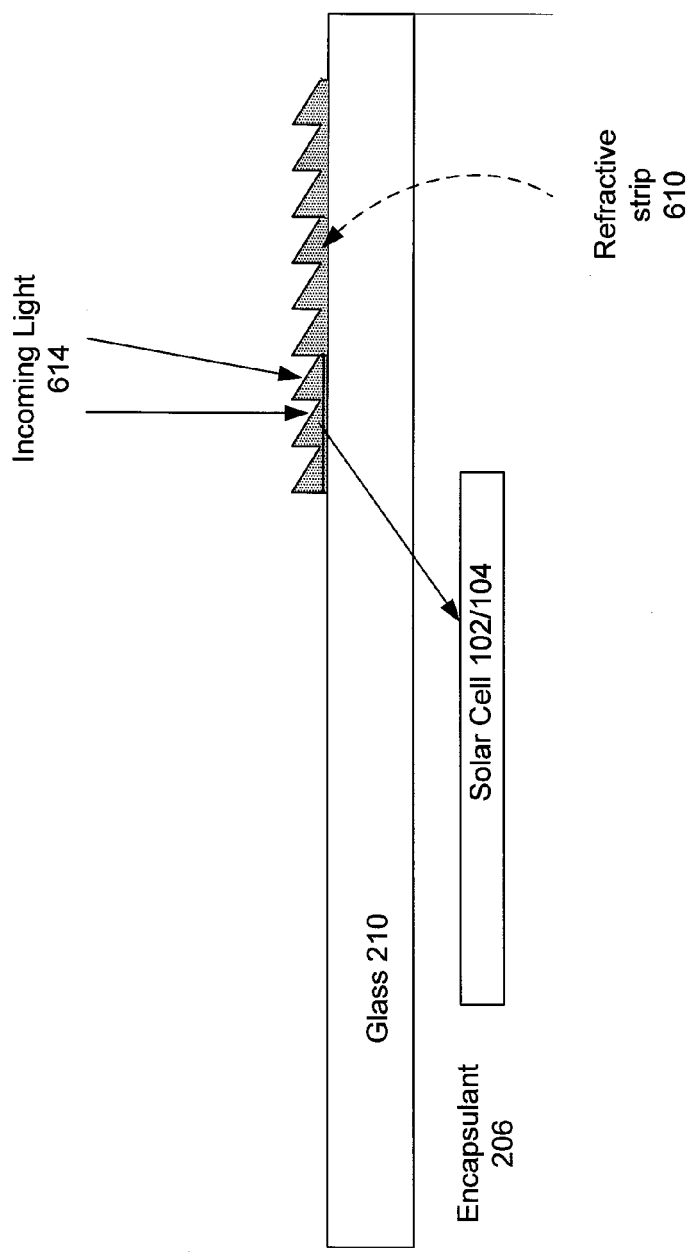
FIG. 6A is a cross-sectional view of a portion of a bifacial photovoltaic module showing a refractive element in accordance with an embodiment of the invention.

FIG. 6A is a cross-sectional view of a portion of a bifacial photovoltaic module showing a refractive strip 610 in accordance with an embodiment of the invention. The refractive strip 610 may comprise a material with an index of refraction and angled faces so as to direct illumination (see example light paths 614) inwardly towards the edge cells of the module. In one embodiment, the refractive strip 610 would not be implemented on a bottom edge of a solar panel to avoid increasing soiling issues, while it might be used for the other edges of the solar panel.

Figure 6B:
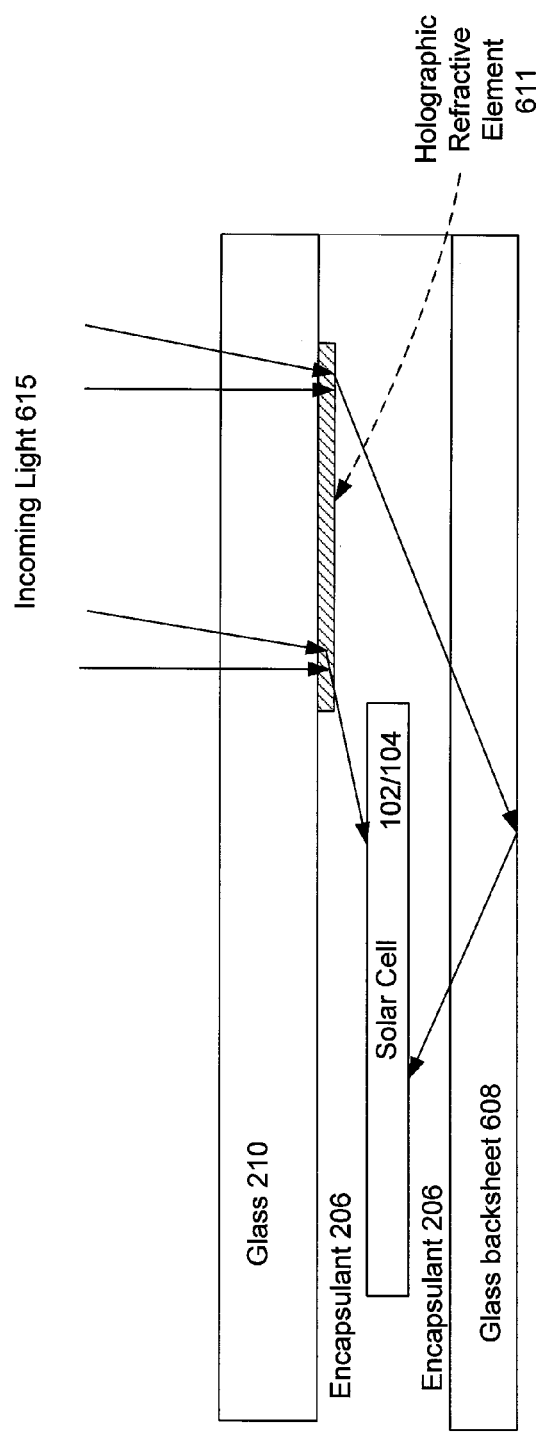
FIG. 6B is a cross-sectional view of a portion of a bifacial photovoltaic module showing a holographic element in accordance with an embodiment of the invention.

Alternatively, as depicted in FIG. 6B, the strip 611 may accomplish the deflection of light by means of holographic refraction. The strip (holographic refractive element) 611 may be positioned to refract the majority of the light to the front side of the cell, but also deflect a portion of the light onto the back side of the cell directly and through internal reflection from the glass/air interface of glass 608 on the back side of the module.

Figure 7:
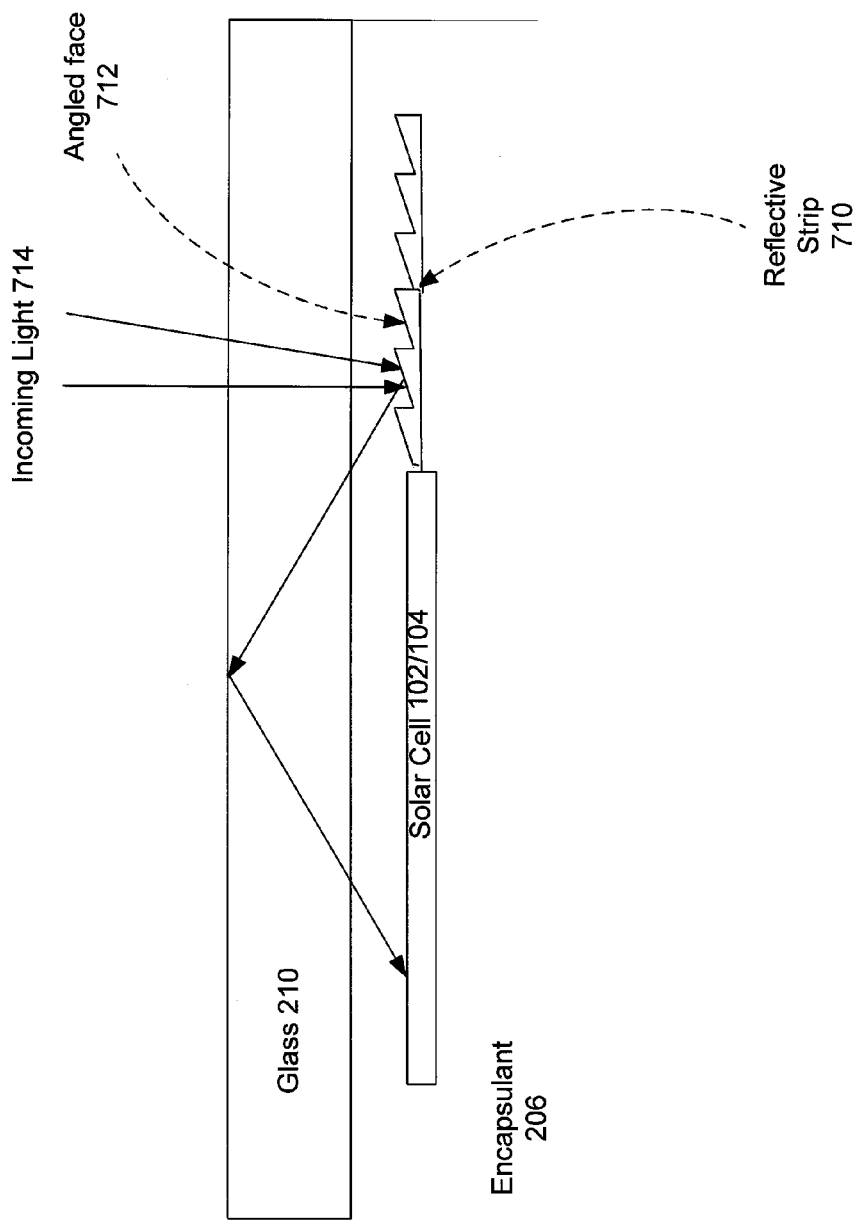
FIG. 7 is a cross-sectional view of a portion of a bifacial photovoltaic module showing a reflective strip with angled faces in accordance with an embodiment of the invention.

FIG. 7 is a cross-sectional view of a portion of a bifacial photovoltaic module showing a reflective strip 710 with angled faces 712 in accordance with an embodiment of the invention. One preferred embodiment uses a specularly reflective strip. As shown by the profile of the reflective strip 710, the strip has angled faces 712 which are directed inwardly towards the interior of the array of solar cells of the module. An example path of light 714 reflected by the edge reflective strip 710 is shown as the sunlight is reflected from the strip 710, internally reflected from the surface of the front glass 210, and then illuminates the front face of an edge cell 102/104. Material options for this type of specularly-reflective strip include those described in U.S. Pat. Nos. 5,994,641, 6,008,449, 6,323,415, and 7,238,878, and references cited therein.

In accordance with an embodiment of the invention, configuring reflective strips along edges (for example, the top and bottom edges) of the bifacial module effectively prevents the end cells from being current limiters. The reflective strips should generally be effective even if they are smaller in area than the shaded area on the back side of the module. This is because, despite the fact that reflection from material on the front yields only about a 25-60% recapture from reflection (assume 30% recapture to be conservative), the irradiance on the front side of the module is typically multiple times stronger (for example, about five times stronger) than the irradiance on the back side of the module. In addition, the cell efficiency is typically 60% to 100% higher on the front side than on the back side. Therefore, per applicant's calculation, to make up for 30% shade coverage of the back side of the end cells of size 12.5 cm×12.5 cm, the area of the width of the reflective strip need only be about 0.85 cm. Applicant believes that a width of the reflective strip in the range of 0.5 cm to 1.0 cm for a 12.5 cm width solar cell is desirable for most applications. More generally, a reflective strip having a width in the range of 4% to 8% of the cell width is a desirable range for most applications. Example calculations by applicant show that, assuming 30% shade coverage of the back side, then the mismatch in power from a center cell to a shaded edge cell may be, for example, in a range of 3.5% to 5.2%. However, the addition of an edge reflector strip having a width of 7% of the width of a cell results in the power mismatch being reduced to a range of 0.4% to 2.7%. Note that these are merely example calculations to show that substantial advantages are obtainable using embodiments of the present invention.

Applicant further notes that, surprisingly, adding reflective material to the "diamond shape" interstitial areas in between four solar cells is likely to be counterproductive. This is because, while such additional reflective material would increase the illumination on cells, the increase in illumination would not preferentially be on cells at the edges of the array. Rather, most of the increase in illumination would be received by the center (interior) cells. Hence, the additional reflective material would not result in decreasing the mismatch in the power (wattage) generated by the center and end row cells. Rather, the mismatch in generated current may be increased. Adding reflective material to the linear area between two adjacent cells is also likely to be counterproductive if no edge reflector is used, but may increase energy production from the module if sufficient edge reflector is used. The previous state of the art merely attempted to reduce blockage of the end row cells by positioning busbars outside of the cell area, using a small junction box mounted at the edge of the module, and/or reducing frame shadowing. Applicant does not believe that there was any previous satisfactory solution to the preferential loss of the current contribution from end cells due to soiling on the edge of bifacial modules.

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. The drawings provided are not necessarily to scale and are provided to assist in the understanding of embodiments of the invention.

While specific embodiments of the present invention have been provided, it is to be understood that these embodiments are for illustration purposes and not limiting. Additional embodiments will be apparent to persons of ordinary skill in the art reading this disclosure.

What is claimed is:

1. A bifacial photovoltaic module comprising:
   an array of solar cells that convert illumination on both a front side and a back side of the solar cells into electrical energy, the array of solar cells including an interstitial area between four adjacent solar cells;
   a first reflector on a first edge of the array of solar cells, the first reflector being configured to reflect light toward a front glass covering the front side of the solar cells; and
   the front glass covering the front side of the solar cells, the front glass being configured to reflect the light reflected by the first reflector onto the front side of a row of solar cells adjacent to the first edge,
   wherein the interstitial area between the four adjacent solar cells does not have a reflector.

2. The bifacial photovoltaic module of claim 1, further comprising:
   a second reflector on a second edge of the array of solar cells, the second reflector being configured to reflect light onto the front side of a row of solar cells adjacent to the second edge,
   wherein the first and second edges are on opposing ends of the module.

3. The bifacial photovoltaic module of claim 2, further comprising:
   a third reflector on a third edge of the array of solar cells, the third reflector being configured to reflect light onto the front side of a row of solar cells adjacent to the third edge; and
   a fourth reflector on a fourth edge of the array of solar cells, the fourth reflector being configured to reflect light onto the front side of a row of solar cells adjacent to the fourth edge,
   wherein the third and fourth edges are on opposing ends of the module.

4. The bifacial photovoltaic module of claim 1, further comprising:
   a laminate in which the array of solar cells is embedded; and
   a backsheet covering the laminate on the back side of the array of solar cells.

5. The bifacial photovoltaic module of claim 4, wherein the backsheet has reflective material on one or more edges of the module.

6. The bifacial photovoltaic module of claim 1, wherein the first reflector is a reflective strip of material.

7. The bifacial photovoltaic module of claim 6, wherein the reflective strip is white in color.

8. The bifacial photovoltaic module of claim 6, wherein the reflective strip provides diffuse reflectance.

9. The bifacial photovoltaic module of claim 1, further comprising:
   non-rectangular features on the first reflector.

10. The bifacial photovoltaic module of claim 1, wherein the first reflector comprises a plurality of angled faces in a series directed inwardly towards an interior of the array of solar cells such that light reflected from the angled faces is internally reflected from a surface of the front glass.

11. The bifacial photovoltaic module of claim 10, wherein the angled faces are at a same angle relative to the surface of the front glass.

* * * * *